(12) United States Patent
Misra et al.

(10) Patent No.: US 9,754,905 B1
(45) Date of Patent: Sep. 5, 2017

(54) FINAL PASSIVATION FOR WAFER LEVEL WARPAGE AND ULK STRESS REDUCTION

(71) Applicant: International Business Machines Corporation, Armonk, NY (US)

(72) Inventors: Ekta Misra, Carmel, NY (US); Krishna R. Tunga, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/292,433

(22) Filed: Oct. 13, 2016

(51) Int. Cl.
*H01L 23/00* (2006.01)

(52) U.S. Cl.
CPC .............. *H01L 24/05* (2013.01); *H01L 24/03* (2013.01); *H01L 24/11* (2013.01); *H01L 24/13* (2013.01); *H01L 2224/0219* (2013.01); *H01L 2224/02166* (2013.01); *H01L 2224/02185* (2013.01); *H01L 2224/03013* (2013.01); *H01L 2224/03416* (2013.01); *H01L 2224/03602* (2013.01); *H01L 2224/0401* (2013.01); *H01L 2224/05015* (2013.01); *H01L 2224/05025* (2013.01); *H01L 2224/05191* (2013.01); *H01L 2224/05691* (2013.01); *H01L 2224/13111* (2013.01); *H01L 2224/13139* (2013.01); *H01L 2924/07025* (2013.01); *H01L 2924/3511* (2013.01)

(58) Field of Classification Search
CPC .............. H01L 2224/0569–2224/05691; H01L 2224/05552–2224/05555; H01L 2224/0519–2224/05191; H01L 2224/05012–2224/05015; H01L 2224/0401; H01L 2224/02126; H01L 2224/02166; H01L 2224/03416; H01L 2224/03011–2224/03019; H01L 2224/0215; H01L 2224/0219; H01L 2224/0558–2224/05584

See application file for complete search history.

(56) References Cited

U.S. PATENT DOCUMENTS

| | | | | |
|---|---|---|---|---|
| 5,977,632 | A * | 11/1999 | Beddingfield | H01L 24/11 257/734 |
| 8,198,133 | B2 * | 6/2012 | Daubenspeck | H01L 24/03 438/108 |
| 8,338,286 | B2 | 12/2012 | Perfecto et al. | |

(Continued)

OTHER PUBLICATIONS

Gonzalez et al. "Design aspects for CPI robust BEOL," 15th Intl. IEEE Conf. Thermal, mechanical and multi-physics simulation and experiments in microelectronics and microsystems (eurosime), (2014), pp. 1-5.

(Continued)

*Primary Examiner* — Kevin Parendo
(74) *Attorney, Agent, or Firm* — Cantor Colburn LLP; Steven Meyers

(57) ABSTRACT

Embodiments are directed to a method of forming a semiconductor chip package and resulting structures having an annular PSPI region formed under a BLM pad. An annular region is formed under a barrier layer metallurgy (BLM) pad. The annular region includes a photosensitive polyimide (PSPI). A conductive pedestal is formed on a surface of the BLM pad and a solder bump is formed on a surface of the conductive pedestal. The annular PSPI region reduces wafer warpage and ULK peeling stress.

6 Claims, 16 Drawing Sheets

(56) References Cited

U.S. PATENT DOCUMENTS

| | | |
|---|---|---|
| 8,513,814 B2 | 8/2013 | Daubenspeck et al. |
| 8,710,682 B2 | 4/2014 | Dershem et al. |
| 2008/0067676 A1 | 3/2008 | Daubenspeck et al. |
| 2008/0169559 A1 | 7/2008 | Yang |
| 2009/0189286 A1* | 7/2009 | Daubenspeck ......... H01L 24/11 257/762 |
| 2010/0283149 A1* | 11/2010 | Chen ..................... H01L 24/03 257/737 |
| 2011/0266670 A1* | 11/2011 | England ................ H01L 23/562 257/738 |
| 2012/0018883 A1* | 1/2012 | Shen ..................... H01L 24/03 257/737 |
| 2012/0061823 A1* | 3/2012 | Wu .................... H01L 23/3157 257/737 |
| 2012/0061832 A1* | 3/2012 | Daubenspeck ......... H01L 24/05 257/738 |
| 2012/0083114 A1* | 4/2012 | Perfecto ................. H01L 24/03 438/614 |
| 2012/0248605 A1* | 10/2012 | Yamaguchi ............ H01L 24/03 257/738 |
| 2013/0334656 A1* | 12/2013 | Jin ..................... H01L 23/5256 257/529 |
| 2014/0319695 A1* | 10/2014 | Hsieh ..................... H01L 24/13 257/774 |
| 2017/0077052 A1* | 3/2017 | Mariottini ............... H01L 24/05 |

OTHER PUBLICATIONS

Misra et al. "Novel Design and Integration Enhancements in the Final Polymeric Passivation for Improved Mechanical Performance and C4 Electromigration in Lead-free C4 Products," Proc. 62nd IEEE ECTC Conf. (2012), pp. 571-576.

* cited by examiner

FINAL PASSIVATION FOR WAFER LEVEL WARPAGE AND ULK STRESS REDUCTION

BACKGROUND

The present invention relates in general to semiconductor chip packages. More specifically, the present invention relates to fabrication methods and resulting structures for a semiconductor chip package having an annular photosensitive polyimide (PSPI) region formed under a BLM pad.

A semiconductor chip, also commonly referred to as an integrated circuit (IC) chip or die is typically assembled into a semiconductor chip package that is soldered to a printed circuit board during a far back end of line (FBEOL) integration scheme. One type of semiconductor chip package is a flip chip, also known as a controlled collapse chip connection ("C4") package. The semiconductor chip package typically includes the IC chip, which contains a number of round solder bumps ("C4s") that are attached to a top surface of the chip. The IC chip, via the solder bumps, is soldered to solder pads located along a surface of a package substrate, forming a metallurgical joint between the chip and the substrate. On package I/O (OPIO), optics, and dual chip modules (DCM) are becoming key components for enabling next generation semiconductor chip packaging, especially for server systems. These next generation packages include under-bump metallization (UBM) layers, also referred to as barrier layer metallurgy (BLM) pads, which provide an electrical connection from the die to the solder bump. One or more stacked metallization layers are formed between the BLM pad and the C4. The C4s carry electrical current between the semiconductor chip and the substrate.

SUMMARY

According to embodiments of the present invention, a method of fabricating a semiconductor chip package having an annular PSPI region formed under a BLM pad is provided. The method can include forming an annular region under a barrier layer metallurgy (BLM) pad. The annular region includes a photosensitive polyimide (PSPI). A conductive pedestal is formed on a surface of the BLM pad and a solder bump is formed on a surface of the conductive pedestal. The annular PSPI region reduces wafer warpage and ULK peeling stress.

According to embodiments of the present invention, a method of fabricating a semiconductor chip package having an annular PSPI region formed under a BLM pad is provided. The method can include forming a contacting layer over a hard dielectric via. A dielectric layer is formed over the contacting layer and a portion of the dielectric layer is removed to form a cavity exposing a surface and sidewalls of the contacting layer. The cavity is filled with PSPI and portions of the PSPI are removed to expose a surface of the contacting layer. The remaining portions of the PSPI form an annular region. A BLM pad is formed on the exposed surface of the contacting layer.

According to embodiments of the present invention, a semiconductor structure having an annular PSPI region formed under a BLM pad is provided. The annular region includes a photosensitive polyimide (PSPI). A conductive pedestal is formed on a surface of the BLM pad and a solder bump is formed on a surface of the conductive pedestal. The annular PSPI region reduces wafer warpage and ULK peeling stress.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
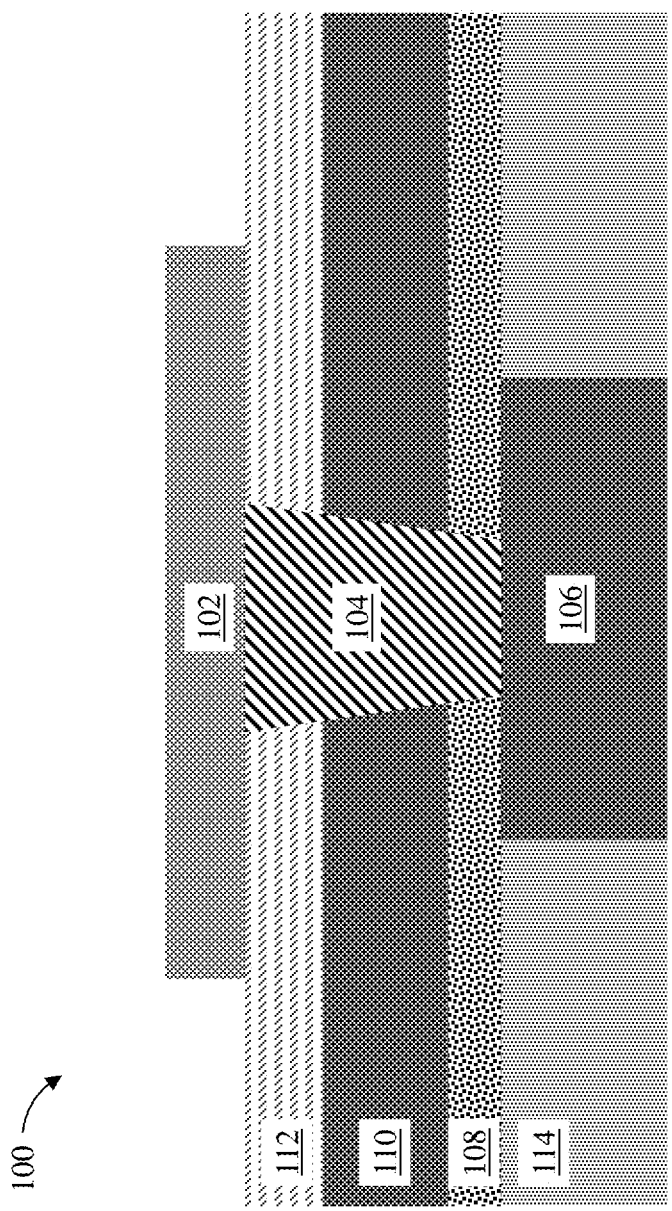
FIG. 1 depicts a cross-sectional view of a structure having a contacting layer formed over a hard dielectric via during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

As used here, the term "conformal" (e.g., a conformal layer) means that the thickness of the layer is substantially the same on all surfaces, or that the thickness variation is less than 15% of the nominal thickness of the layer.

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Turning now to a more detailed description of technologies relevant to the present invention, as previously noted herein, next generation chip packages include one or more stacked metallization layers (also known as "pedestals" and "pillars") formed between a BLM pad and a C4 to provide an electrical connection from a semiconductor chip or die to a substrate. Conventionally, a polymer based material, such as a photosensitive polyimide (PSPI) layer, is formed between a BLM pad and back end of line (BEOL) oxide layers to reduce thermal-mechanical stresses within ultra low-k (ULK) dielectric layers formed below the oxide layers. While a PSPI layer reduces the ULK stresses, PSPI tends to shrink by roughly 50% when cured, causing an increase in wafer level warpage post cure. Consequently, conventional packages leveraging PSPI require a tradeoff between acceptable levels of ULK stresses and wafer level warpage. Warpage causes wafer handling issues in downstream fabrication processes which could lead to wafer breakage and extended periods of tool downtime. Thus, a method and structure are desired for a semiconductor chip package capable of reducing wafer level warpage without causing a substantial increase in stresses within the ULK layers.

Turning now to an overview of aspects of the present invention, one or more embodiments provide methods of fabricating a semiconductor chip package having an annular PSPI region formed under a BLM pad. In some embodiments, the remaining area under the BLM pad consists of hard dielectric. In this manner, the percentage of PSPI present on the wafer is reduced, significantly reducing wafer bow while still allowing for PSPI to act as a stress buffer underneath an edge of the BLM. Consequently, wafer level warpage is reduced without sacrificing the ULK stress mitigation properties of PSPI. In some embodiments, a dielectric layer is patterned with a concentric circle shaped opening having an outer diameter equal to or slightly (5 microns to 10 microns) larger than a diameter of the BLM pad. A spin on process fills the opening with PSPI and the BLM pad is formed over the PSPI. Slightly oversizing the PSPI allows for a 5 micron to 10 micron PSPI extension beyond an edge of the BLM pad, further reducing ULK stresses.

Methods for forming a semiconductor chip package having an annular PSPI region formed under a BLM pad and the resulting structures therefrom in accordance with embodiments of the present invention are described in detail below by referring to the accompanying drawings in FIGS. 1-16.

FIG. 1 illustrates a cross-sectional view of a structure 100 having a contacting layer 102 formed over a hard dielectric via 104 during an intermediate operation of a method of fabricating a semiconductor device according to one or more embodiments. The contacting layer 102 can be any suitable material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The contacting layer 102 can be formed using any known method, such as, for example, an etch process. In some embodiments, the contacting layer 102 is aluminum formed using a subtractive etch process.

The hard dielectric via 104 can be any suitable material, such as, for example, a metal, a conducting metallic compound material, carbon nanotube, conductive carbon, graphene, or any suitable combination of these materials, in a similar manner as the contacting layer 102. In some embodiments, the hard dielectric via 104 is formed on a surface of a last metal region 106 (also known as "last metal pad"). In some embodiments, a trench exposing a surface of the last metal region 106 is patterned in a hard dielectric stack having a first hard dielectric stack layer 108, a second hard dielectric stack layer 110, and a third hard dielectric stack layer 112. In some embodiments, the first hard dielectric stack layer 108 is an NBLOK layer, the second hard dielectric stack layer 110 is a silicon oxide layer, and the third hard dielectric stack layer 112 is a silicon nitride layer. In some embodiments, the hard dielectric via 104 can be formed by filling the trench with copper during a single damascene process. In some embodiments, the hard dielectric via 104 is deposited to overfill the trench, forming an overburden above a surface of the third hard dielectric stack layer 112. The hard dielectric via 104 can then be planarized to remove the overburden using any known process, such as, for example, CMP. In some embodiments, the last metal region 106 is formed in a metallization layer 114. In some embodiments, the metallization layer 114 is a tetraethyl orthosilicate (TEOS) layer.

Figure 2:
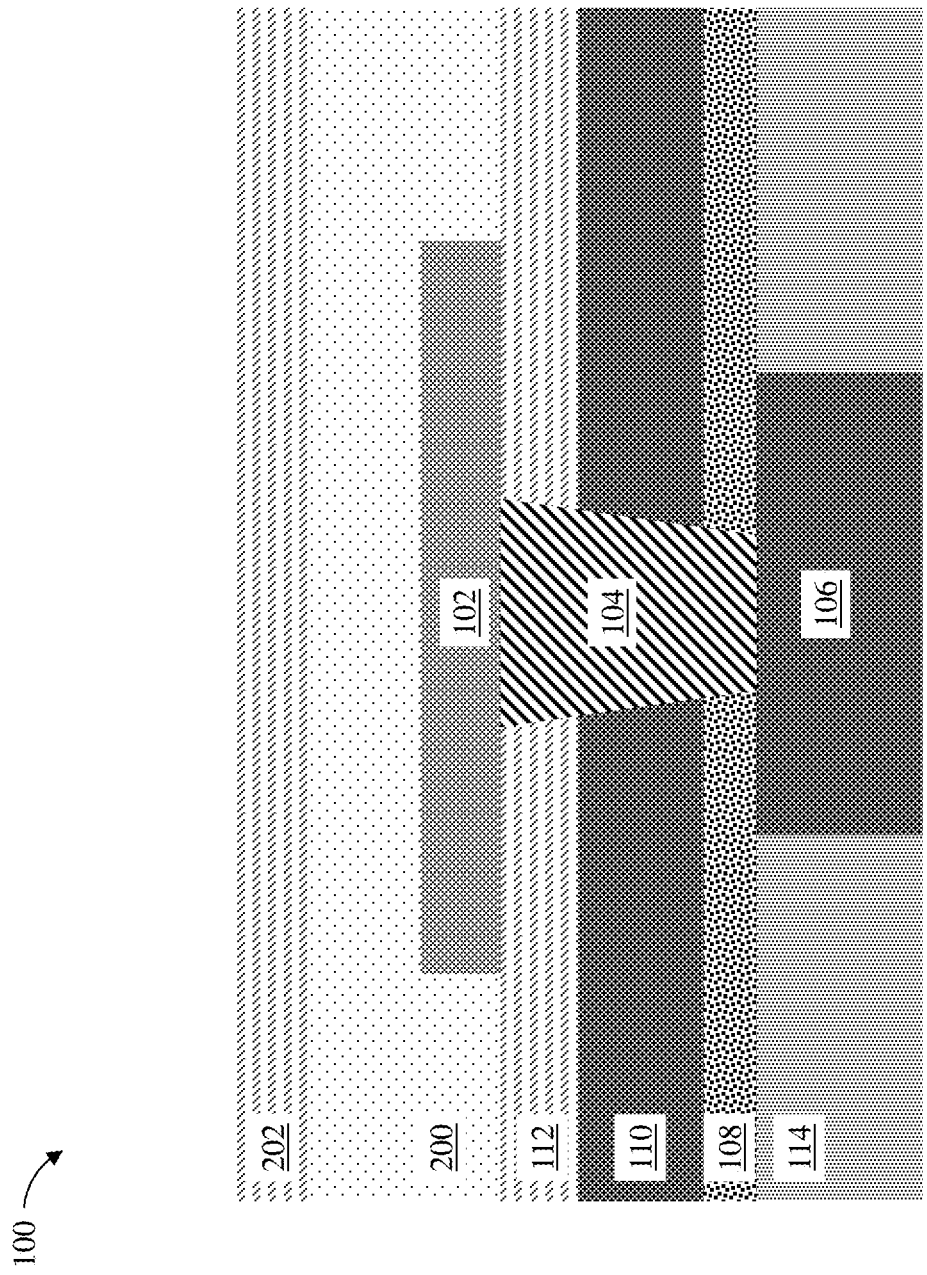
FIG. 2 depicts a cross-sectional view of the structure after forming a first dielectric layer over the contacting layer according to one or more embodiments of the present invention.

FIG. 2 illustrates a cross-sectional view of the structure 100 after forming a first dielectric layer 200 over the contacting layer 102 according to one or more embodiments. In some embodiments, a second dielectric layer 202 is formed over the first dielectric layer 200. The first and second dielectric layers 200 and 202 can be any suitable material, such as, for example, a low-k dielectric, a silicon nitride, a silicon oxide, SiCN, SiCO, SiCNO, SiBCN, and porous SiCOH. In some embodiments, the first dielectric layer 200 is a silicon oxide and the second dielectric layer 202 is a silicon nitride. The first and second dielectric layers 200 and 202 can be formed using any known method, such as, for example, PVD. In some embodiments, the first and second dielectric layers 200 and 202 are sequentially deposited over the contacting layer 102 using PVD.

Figure 3:
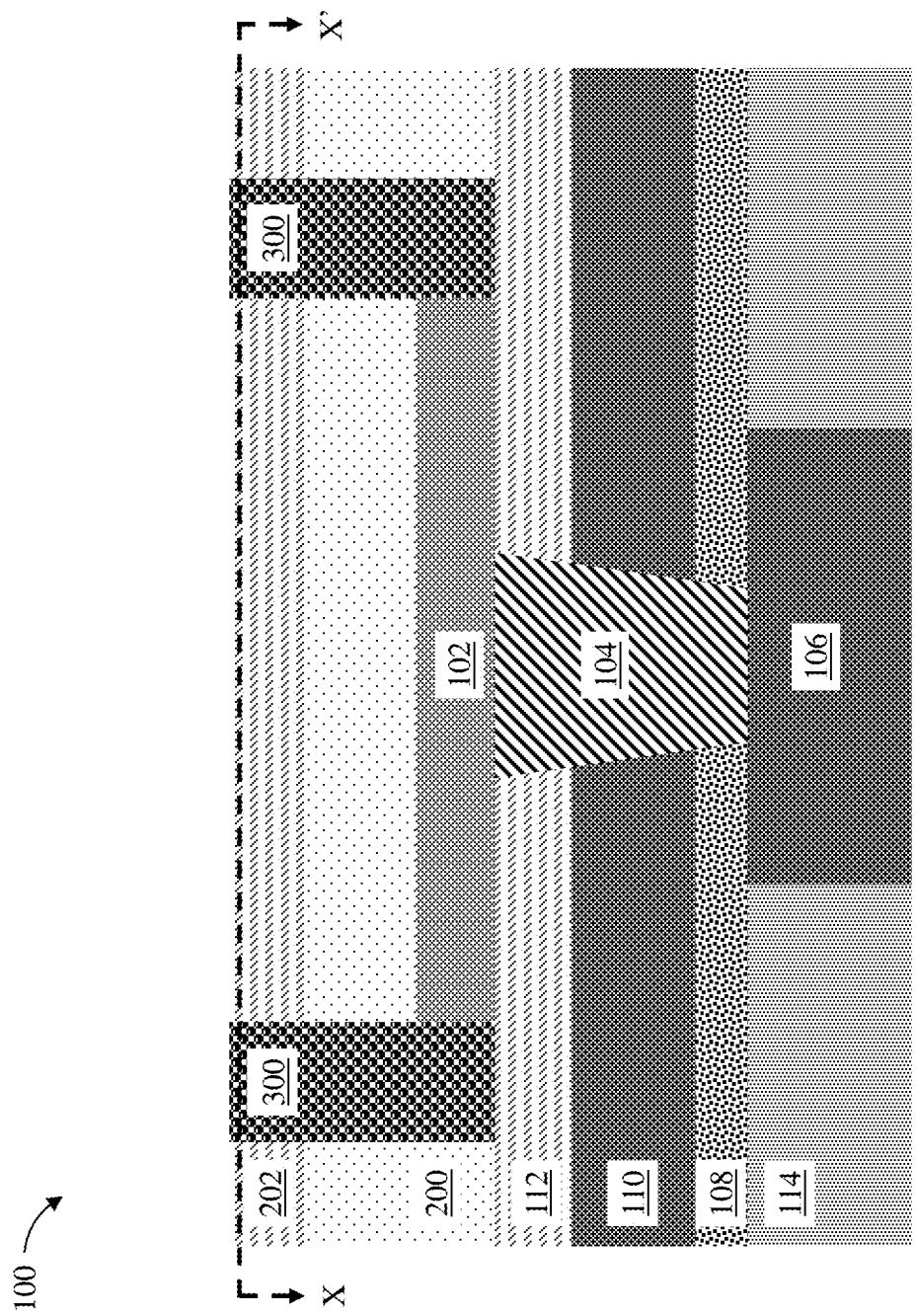
FIG. 3 depicts a cross-sectional view of the structure after forming an annular PSPI region on a surface of the third hard dielectric stack layer according to one or more embodiments of the present invention.

FIG. 3 illustrates a cross-sectional view of the structure 100 after forming an annular PSPI region 300 on a surface of the third hard dielectric stack layer 112 according to one or more embodiments. Forming an annular PSPI region rather than a complete PSPI layer significantly reduces the total percentage of PSPI in the structure 100. Consequently, wafer warpage is significantly reduced (see, e.g., the graph of Wafer Warpage vs PSPI Volume Fraction in FIG. 16). In some embodiments, the annular PSPI region 300 can be formed by removing a first portion of the first and second dielectric layers 200 and 202 to pattern a concentric circle shaped opening that is filled with the PSPI material. The first and second dielectric layers 200 and 202 can be patterned using any known technique, such as, for example, photolithography followed by an etch process. In some embodiments, an outer diameter of the annular PSPI region 300 is about 5 microns to about 10 microns larger than a diameter of the BLM pad 600 (depicted in FIG. 6). In some embodiments, an outer diameter of the annular PSPI region 300 is equal to a diameter of the BLM pad 600.

In some embodiments, a spin-on coating process is used to fill the patterned opening with PSPI to a thickness of about 1 micron to about 2 microns thicker than a total thickness of the first and second dielectric layers 200 and 202 (i.e., the PSPI will extend about 1 to 2 microns above a surface of the second dielectric layer 202), to ensure that PSPI completely fills the opening. The excess PSPI can be removed using any suitable process, such as, for example, ashing the excess PSPI from the surface of the second dielectric layer 202 to planarize the PSPI. Localized masking can be used to avoid ashing the PSPI filling the opening.

Figure 4:
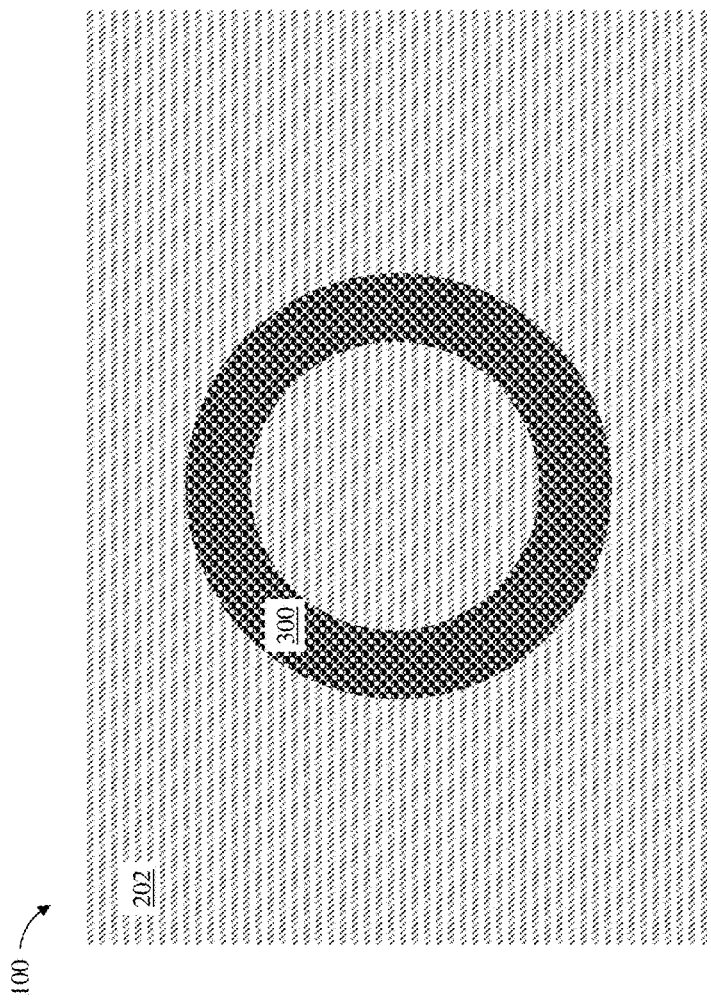
FIG. 4 depicts a top-down cross-sectional view of the structure along the line X-X' of FIG. 3 after forming the annular PSPI region according to one or more embodiments of the present invention.

FIG. 4 illustrates a top-down cross-sectional view of the structure 100 along the line X-X' of FIG. 3 after forming the annular PSPI region 300 according to one or more embodiments. From this view, it is clear that the annular PSPI region 300 is formed by filling an opening patterned by an inner and an outer concentric circle (i.e., the inner and outer diameter of the annular PSPI region 300).

Figure 5:
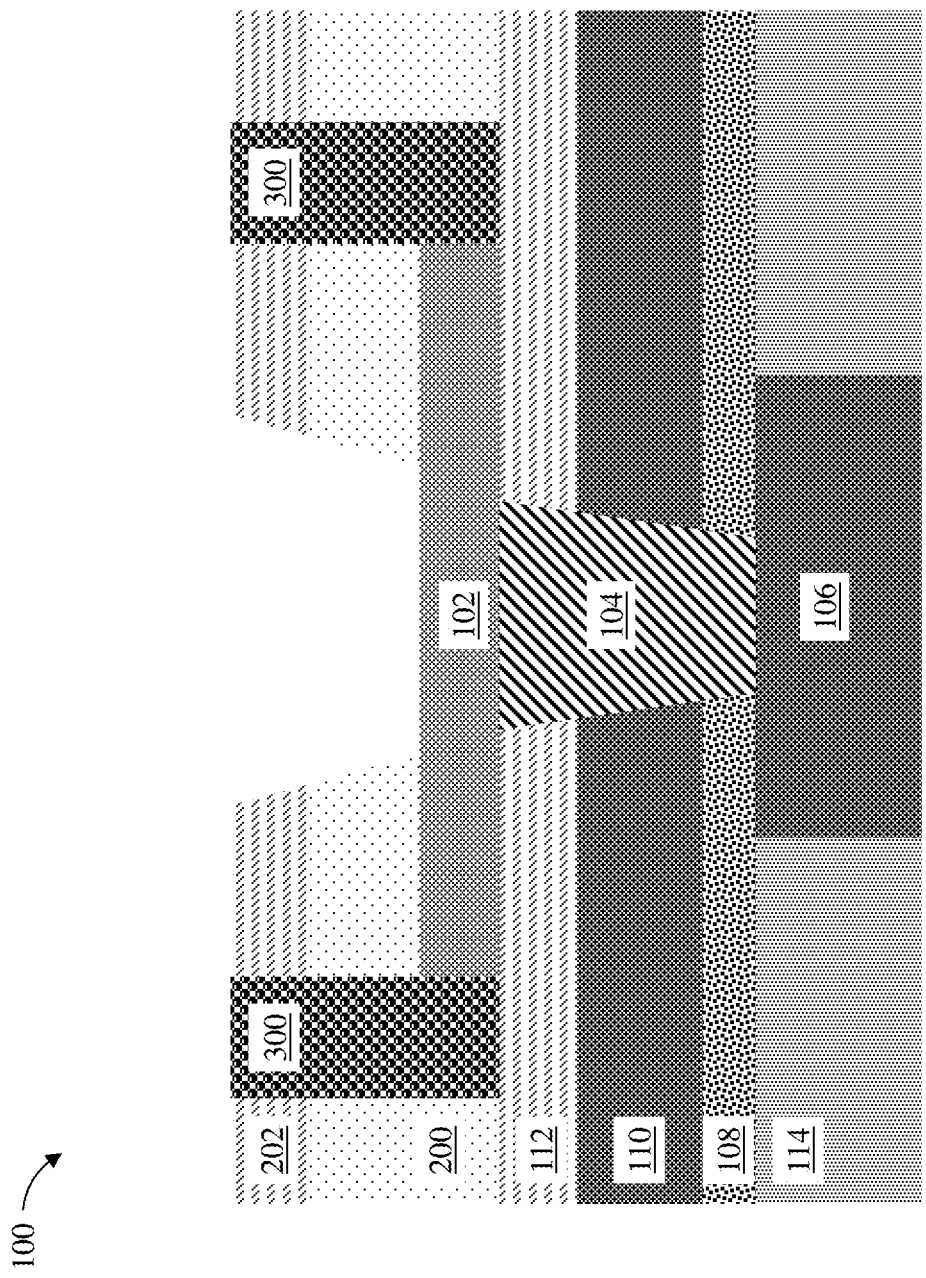
FIG. 5 depicts a cross-sectional view of the structure after removing a second portion of the first and second dielectric layers to expose a surface of the contacting layer according to one or more embodiments of the present invention.

FIG. 5 illustrates a cross-sectional view of the structure 100 after removing a second portion of the first and second dielectric layers 200 and 202 to expose a surface of the contacting layer 102 according to one or more embodiments. The second portion of the first and second dielectric layers 200 and 202 can be removed using any known technique, such as, for example, a wet or dry etch process.

Figure 6:
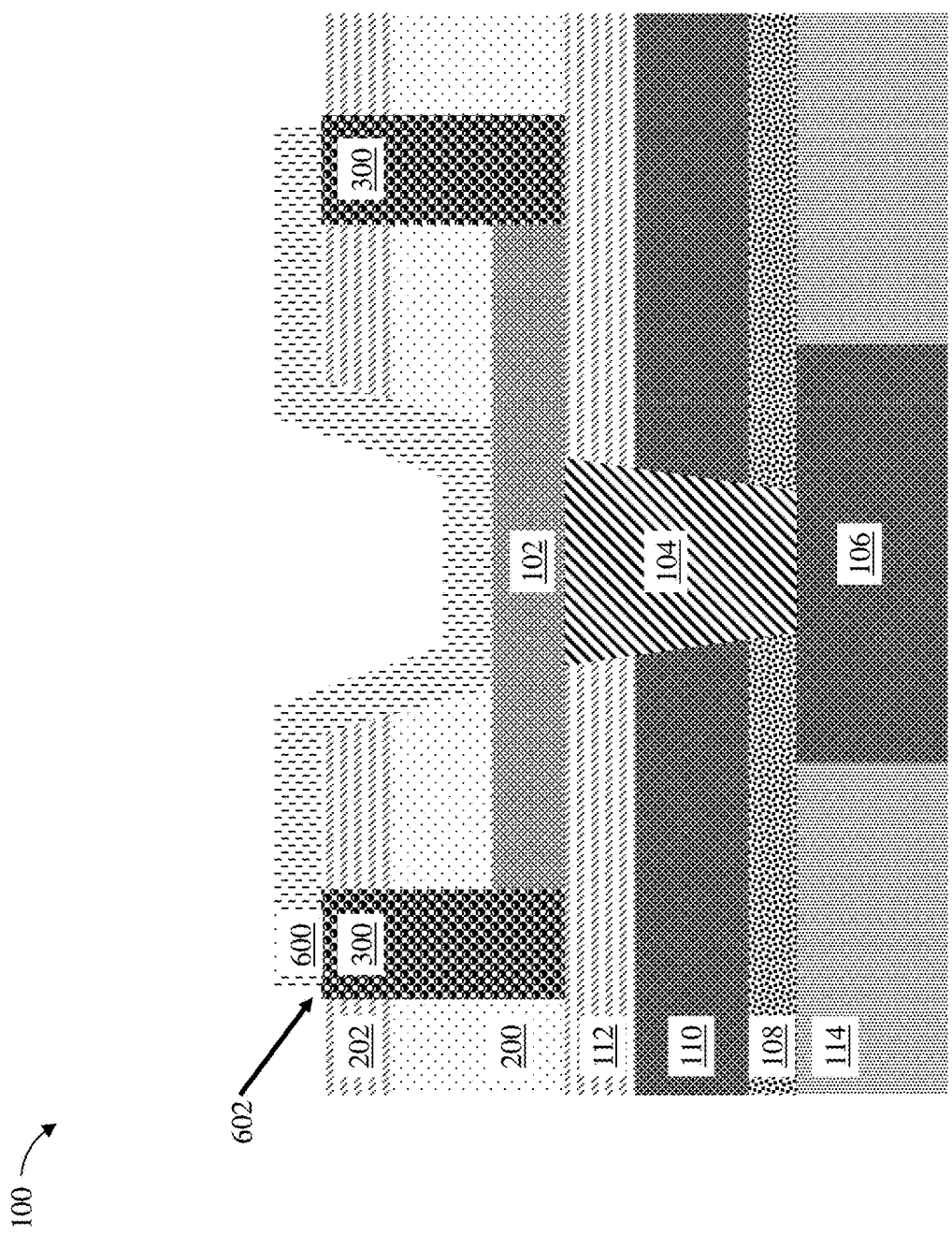
FIG. 6 depicts a cross-sectional view of the structure after forming the BLM pad on the exposed surface of the contacting layer according to one or more embodiments of the present invention.

FIG. 6 illustrates a cross-sectional view of the structure 100 after forming the BLM pad 600 on the exposed surface of the contacting layer 102 according to one or more embodiments. The BLM pad 600 can be formed using any known technique, such as, for example, deposition. Portions of the BLM pad 600 (i.e., edge regions of the BLM pad 600) extend over a surface of the annular PSPI region 300. Depending on the outer diameter of the annular PSPI region 300 and the diameter of the BLM pad 600, portions of the annular PSPI region 300 can extend beyond an edge of the BLM pad 600 to form a PSPI extension 602. In some embodiments, the PSPI extension 602 extends about 5 microns to about 10 microns beyond the BLM pad 600. The PSPI extension 602 can be shortened or lengthened to any length, or eliminated entirely, by adjusting the relative diameters of the annular PSPI region 300 and the BLM pad 600 and by adjusting a thickness of the annular PSPI region 300 (e.g., by increasing or decreasing the inner and outer diameter of the annular PSPI region 300).

As discussed previously herein, forming an annular PSPI region rather than a complete PSPI layer under the BLM pad 600 significantly reduces wafer warpage. Because an edge of the BLM pad 600 extends over portions of the annular PSPI region 300 in this configuration, the PSPI material is also able to significantly mitigate ULK stresses (see, e.g., the graph of ULK Peeling Stress vs PSPI Volume Fraction in FIG. 16). By adjusting the PSPI volume fraction (i.e., increasing or decreasing a thickness of the annular PSPI region 300) and configuration (i.e., PSPI annulus, PSPI annulus with 5 micron extension, etc.) a sweet spot having acceptable levels of both ULK stresses and wafer warpage can be reached for a given application. A further advantage of a concentric circle shaped annular region is an increase in process control in the final passivation diameter during FBEOL. Better process control in the final passivation diameter is especially beneficial for reduced pitch (i.e., C4 pitch less than about 130 microns) and micro-bump (i.e., C4s having a diameter less than about 50 microns) applications.

Figure 7:
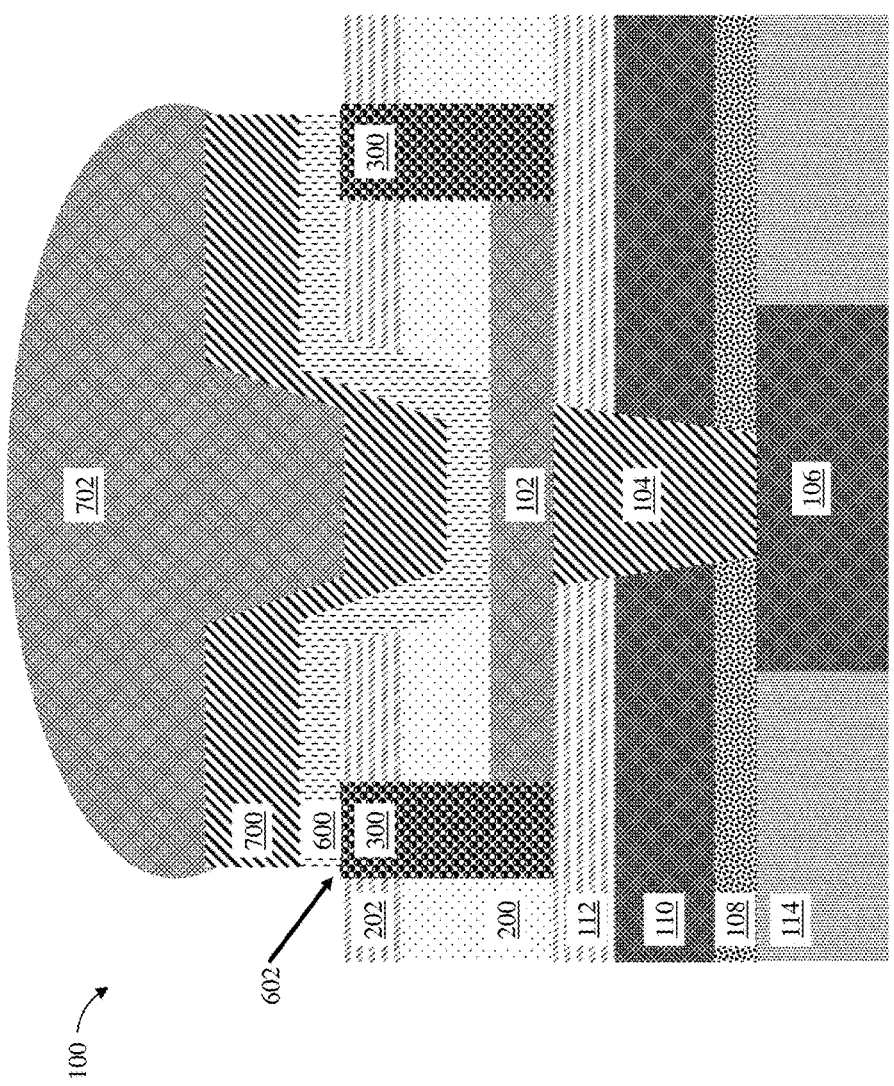
FIG. 7 depicts a cross-sectional view of the structure after forming a conductive pedestal on a surface of the BLM pad according to one or more embodiments of the present invention.

FIG. 7 illustrates a cross-sectional view of the structure 100 after forming a conductive pedestal 700 on a surface of the BLM pad 600 according to one or more embodiments. The conductive pedestal 700 can be any suitable material, such as, for example a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. In some embodiments, the conductive pedestal 700 is a copper pedestal formed on a copper seed layer (not depicted). In some embodiments, the conductive pedestal 700 is a multilayer metallization stack, such as, for example, a two layer stack (e.g., TiW/Cu or Ti/Cu) or a four layer stack (e.g., Ni/Cu/Ni/Cu). In some embodiments, the conductive pedestal 700 is a three layer Cu/Ni/Au stack formed during a 2.5D/3D process flow for an interposer wafer. A solder bump 702 is formed on the conductive pedestal 700. In some embodiments, the solder bump 702 is a lead free solder bump, such as, for example, SnAg or a SnAg alloy.

Figure 8:
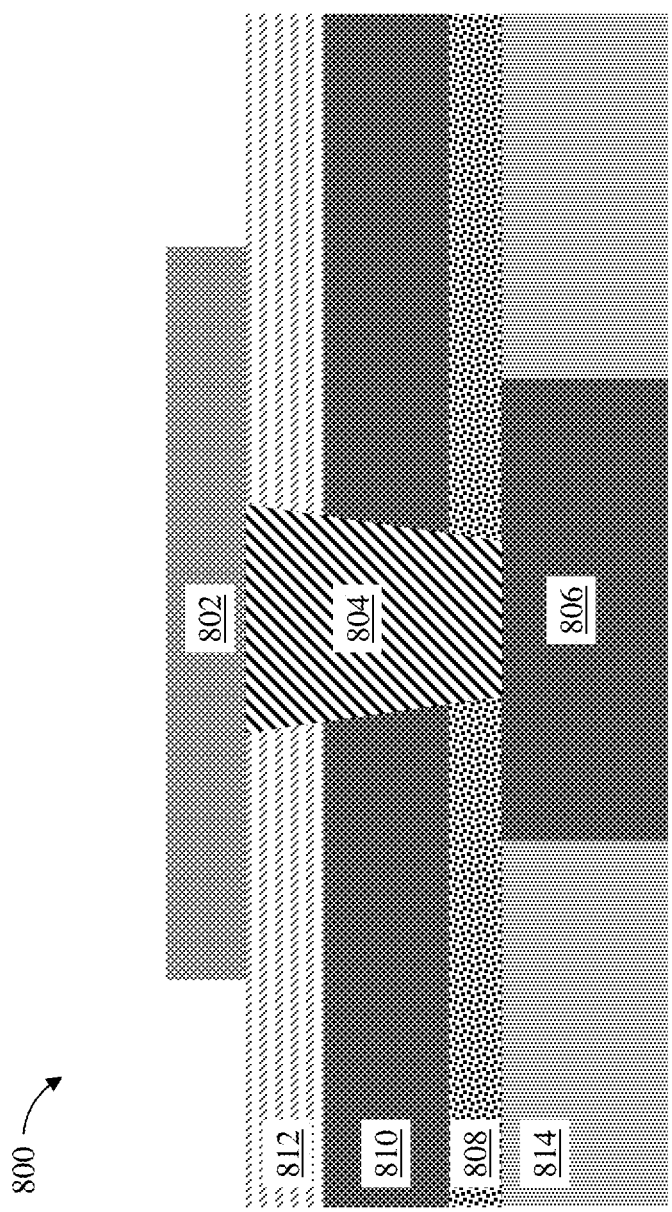
FIG. 8 depicts a cross-sectional view of a structure having a contacting layer formed over a hard dielectric via during an intermediate operation of a method of fabricating a semiconductor device according to one or more embodiments of the present invention.

FIG. 8 illustrates a cross-sectional view of a structure 800 having a contacting layer 802 formed over a hard dielectric via 804 during an intermediate operation of a method of fabricating a semiconductor device according to one or more embodiments. The contacting layer 802 can be any suitable material and formed using any known method in a manner similar to the contacting layer 102 (as depicted in FIG. 1). In some embodiments, the contacting layer 802 is aluminum formed using a subtractive etch process.

The hard dielectric via 804 can be any suitable material, such as, for example, a metal, a conducting metallic compound material, carbon nanotube, conductive carbon, graphene, or any suitable combination of these materials, in a similar manner as the hard dielectric via 104 (as depicted in FIG. 1). In some embodiments, the hard dielectric via 804 is formed on a surface of a last metal region 806 (also known as "last metal pad") in a similar manner as the hard dielectric via 104 is formed on the last metal region 106 (as depicted in FIG. 1). In some embodiments, a trench exposing a surface of the last metal region 806 is patterned in a hard dielectric stack having a first hard dielectric stack layer 808, a second hard dielectric stack layer 810, and a third hard dielectric stack layer 812. In some embodiments, the first hard dielectric stack layer 808 is an NBLOK layer, the second hard dielectric stack layer 810 is a silicon oxide layer, and the third hard dielectric stack layer 812 is a silicon nitride layer. In some embodiments, the hard dielectric via 804 can be formed by filling the trench with copper during a single damascene process. In some embodiments, the hard dielectric via 804 is deposited to overfill the trench, forming an overburden above a surface of the third hard dielectric stack layer 812. The hard dielectric via 804 can then be planarized to remove the overburden using any known process, such as, for example, CMP. In some embodiments, the last metal region 806 is formed in a metallization layer 814. In some embodiments, the metallization layer 814 is a tetraethyl orthosilicate (TEOS) layer.

Figure 9:
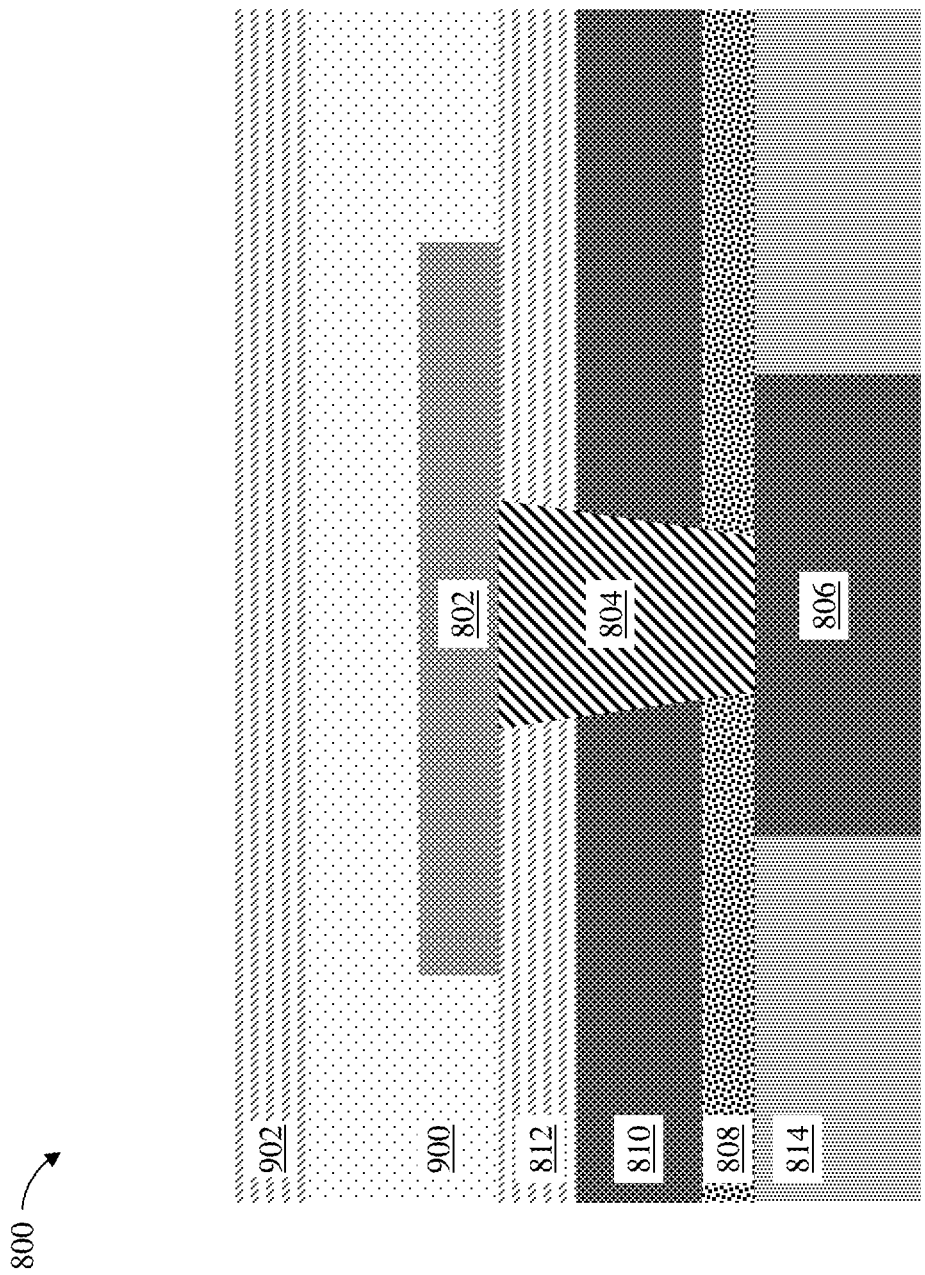
FIG. 9 depicts a cross-sectional view of the structure after forming a first dielectric layer over the contacting layer according to one or more embodiments of the present invention.

FIG. 9 illustrates a cross-sectional view of the structure 800 after forming a first dielectric layer 900 over the contacting layer 802 according to one or more embodiments. In some embodiments, a second dielectric layer 902 is formed over the first dielectric layer 900. The first and second dielectric layers 900 and 902 can be any suitable material, such as, for example, a low-k dielectric, a silicon nitride, a silicon oxide, SiCN, SiCO, SiCNO, SiBCN, and porous SiCOH. In some embodiments, the first dielectric layer 900 is a silicon oxide and the second dielectric layer 902 is a silicon nitride. In some embodiments, the first and second dielectric layers 900 and 902 are compressive oxide layers. Compressive oxide layers can be used in this manner to even further decrease the wafer level warpage. The first and second dielectric layers 900 and 902 can be formed using any known method, such as, for example, PVD. In some embodiments, the first and second dielectric layers 900 and 902 are sequentially deposited over the contacting layer 802 using PVD.

Figure 10:
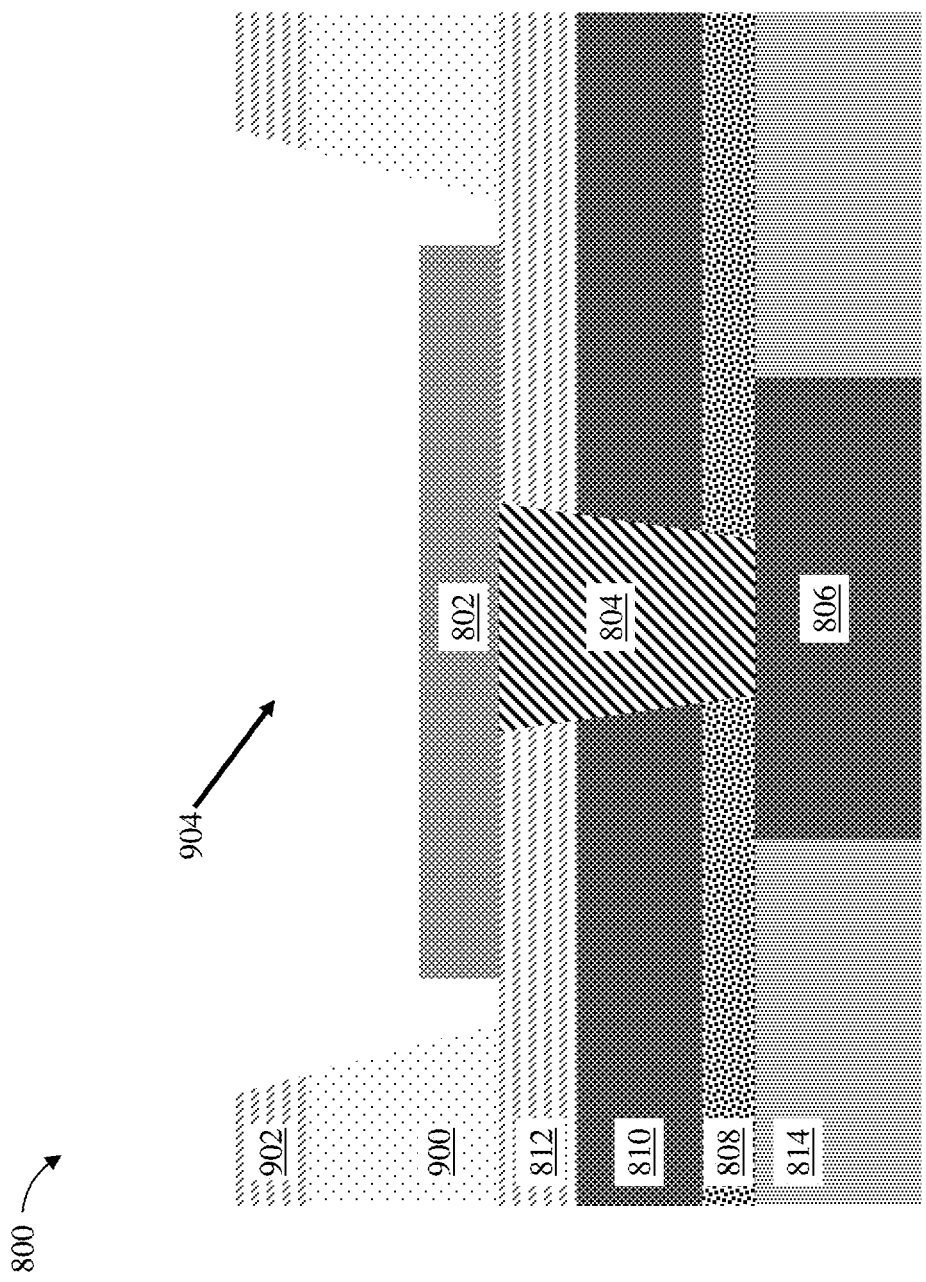
FIG. 10 depicts a cross-sectional view of the structure after removing a portion of the first and second dielectric layers to form a cavity exposing a surface and sidewalls of the contacting layer according to one or more embodiments of the present invention.

FIG. 10 illustrates a cross-sectional view of the structure 800 after removing a portion of the first and second dielectric layers 900 and 902 to form a cavity 904 exposing a surface and sidewalls of the contacting layer 802 according to one or more embodiments. The first and second dielectric layers 900 and 902 can be patterned using any known technique, such as, for example, photolithography followed by an etch process. In some embodiments, the cavity 904 is formed having an outer diameter about 5 microns to about 10 microns larger than a diameter of the BLM pad 1400 (depicted in FIG. 14). In some embodiments, an outer diameter of the cavity 904 is equal to a diameter of the BLM pad 1400.

Figure 11:
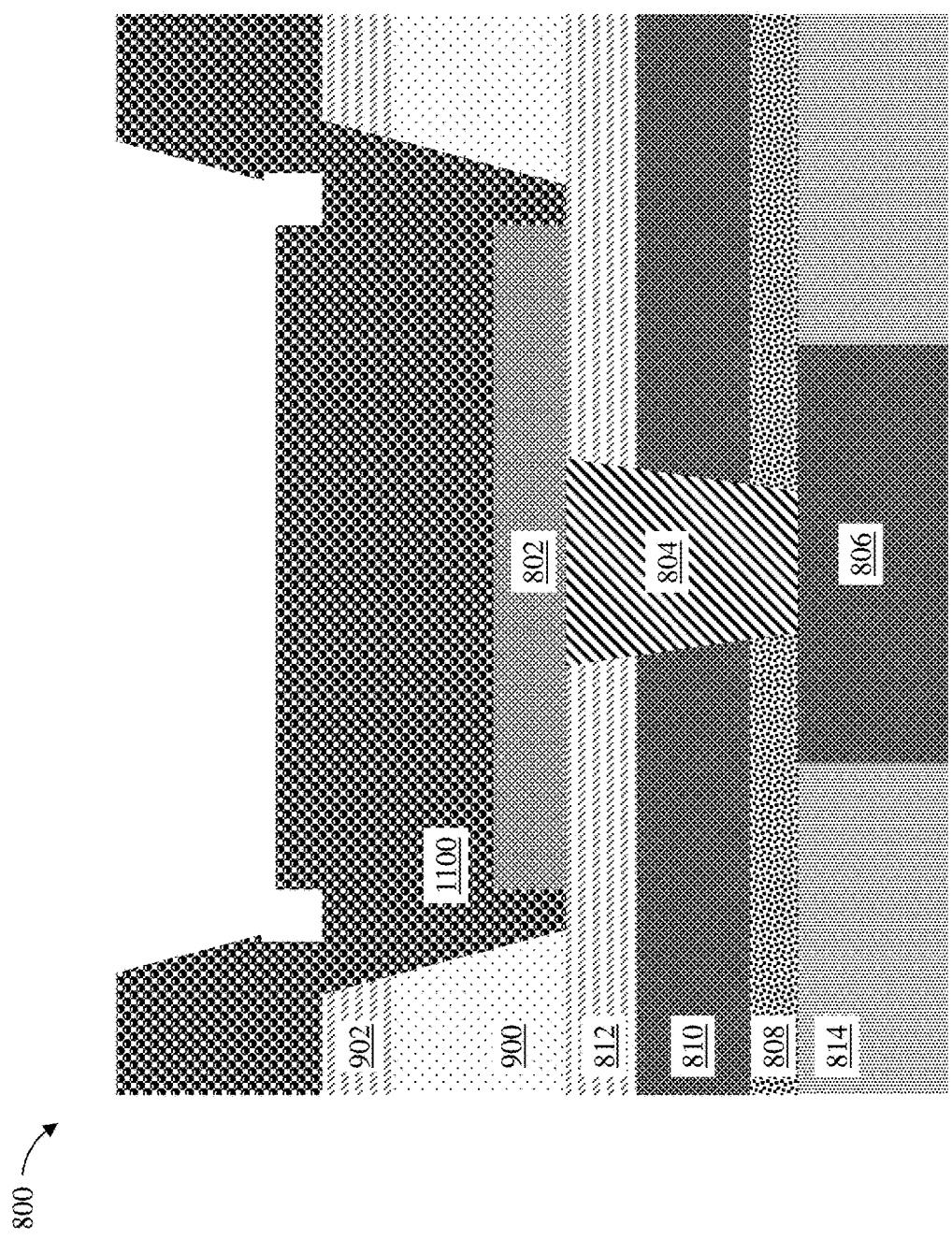
FIG. 11 depicts a cross-sectional view of the structure after filling the cavity with PSPI according to one or more embodiments of the present invention.

FIG. 11 illustrates a cross-sectional view of the structure 800 after filling the cavity 904 with PSPI region 1100 according to one or more embodiments. In some embodiments, a spin-on process is used to form the PSPI region 1100. In some embodiments, the process is conformal and the PSPI region 1100 is conformally formed on a surface of the first and second dielectric layers 900 and 902 and the contacting layer 802.

Figure 12:
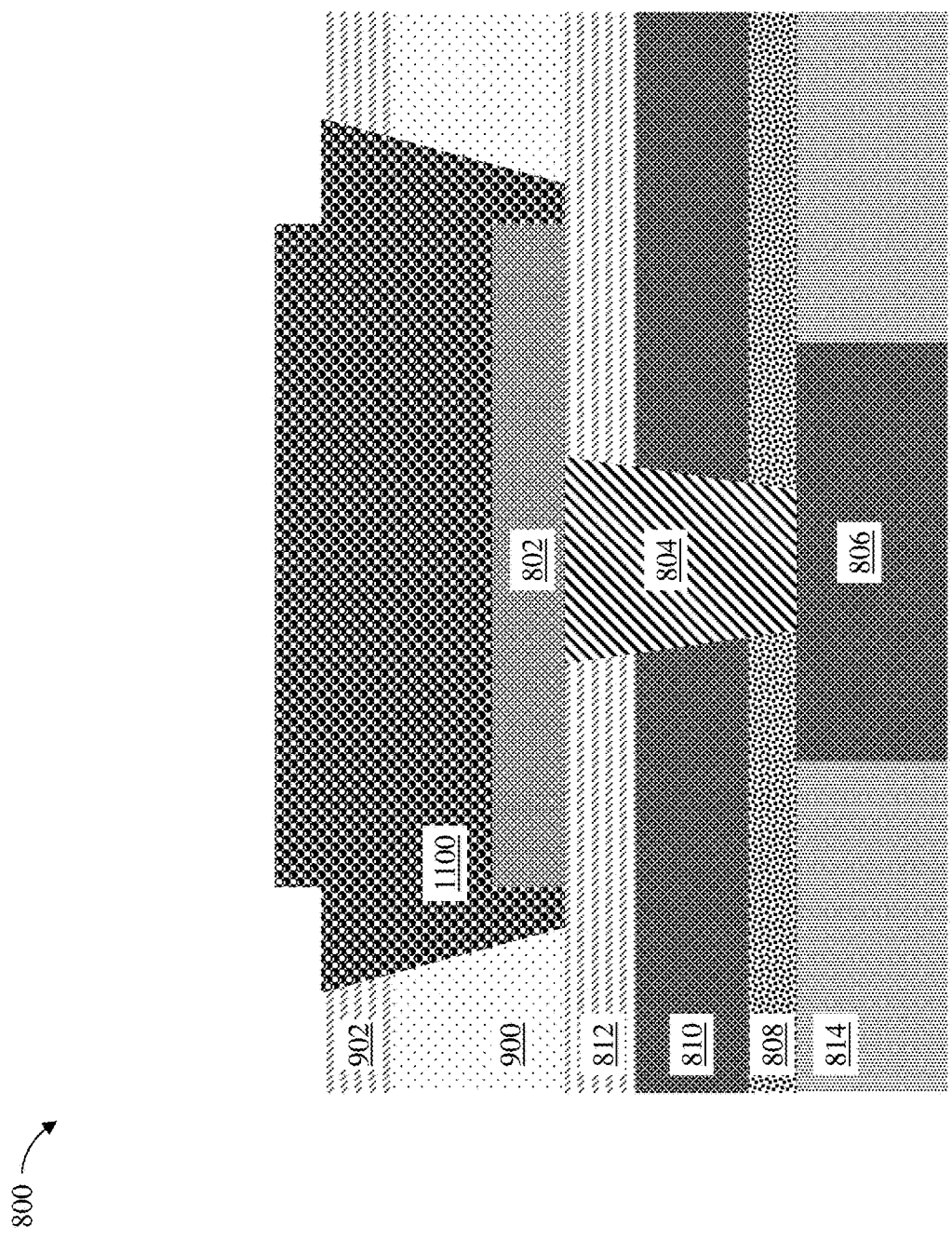
FIG. 12 depicts a cross-sectional view of the structure after removing a first portion of the PSPI region to expose a surface of the second dielectric layer according to one or more embodiments of the present invention.

FIG. 12 illustrates a cross-sectional view of the structure 800 after removing a first portion of the PSPI region 1100 to expose a surface of the second dielectric layer 902 according to one or more embodiments. The first portion of the PSPI region 1100 can be removed using any known technique, such as, for example, a wet or dry etch process. In some embodiments, the PSPI region 1100 is lithographically patterned using a first mask pattern. In some embodiments, the PSPI region 1100 is non-photosensitive and the PSPI region 1100 is laser ablated or ashed from the second dielectric layer 902 using a contact mask.

Figure 13:
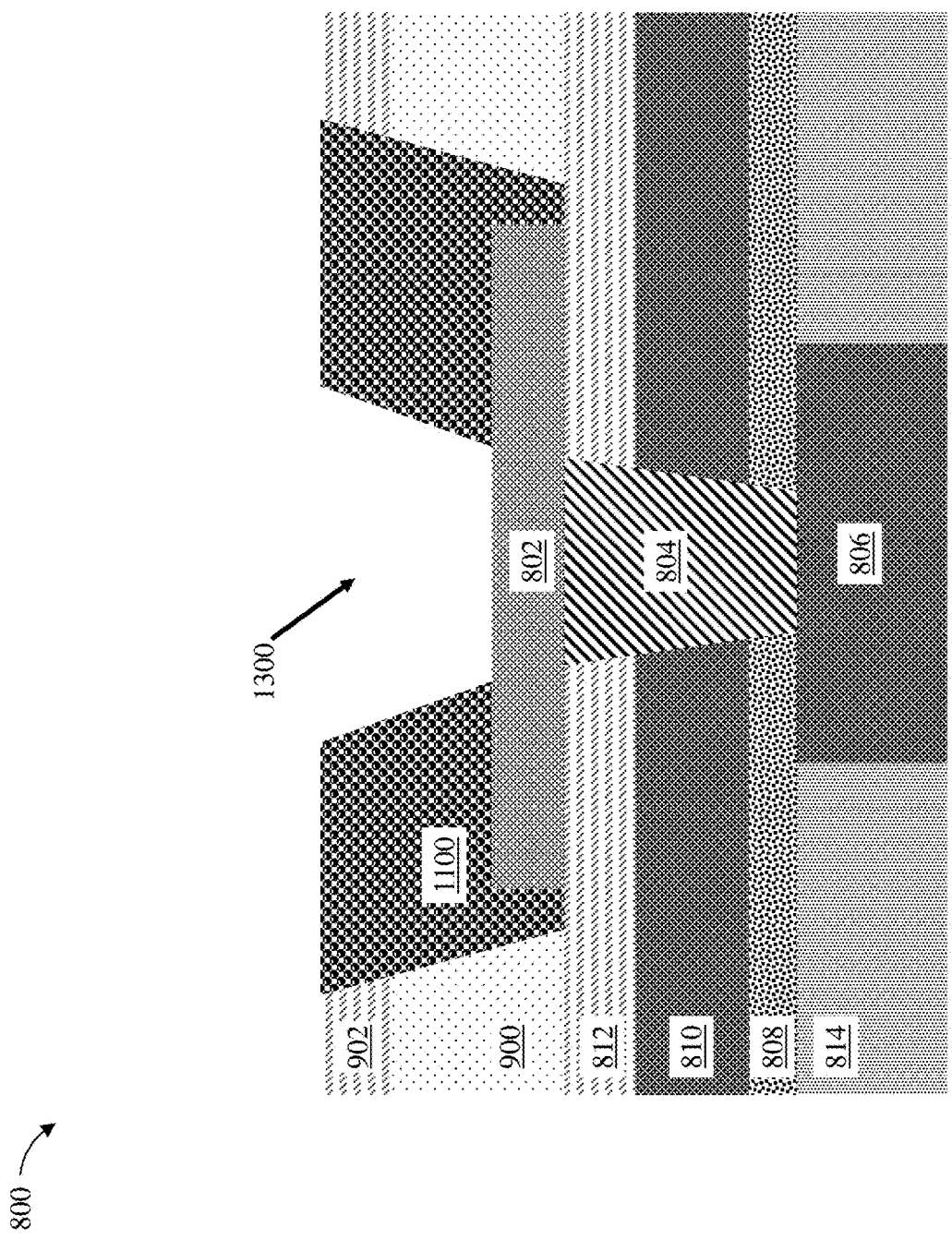
FIG. 13 depicts a cross-sectional view of the structure after removing a second portion of the PSPI region to expose a surface of the contacting layer according to one or more embodiments of the present invention.

FIG. 13 illustrates a cross-sectional view of the structure 800 after removing a second portion of the PSPI region 1100 to expose a surface of the contacting layer 802 according to one or more embodiments. Removing the second portion of the PSPI region 1100 forms a via trench 1300 over the contacting layer 802. The second portion of the PSPI region 1100 can be removed using any known technique, such as, for example, a wet or dry etch process. In some embodiments, the PSPI region 1100 is lithographically patterned using a second mask pattern. In some embodiments, the PSPI region 1100 is planarized to a surface of the second dielectric layer 902. Any known manner can be used to planarize the PSPI region 1100. In some embodiments, an O2 ash process is used to both roughen and planarize the PSPI region 1100. The remaining planarized portion of the PSPI region 1100 forms an annular region. As discussed previously herein, forming an annular PSPI region rather than a complete PSPI layer significantly reduces the total percentage of PSPI in the structure 800. Consequently, wafer warpage is significantly reduced (see, e.g., the graph of Wafer Warpage vs PSPI Volume Fraction in FIG. 16).

Figure 14:
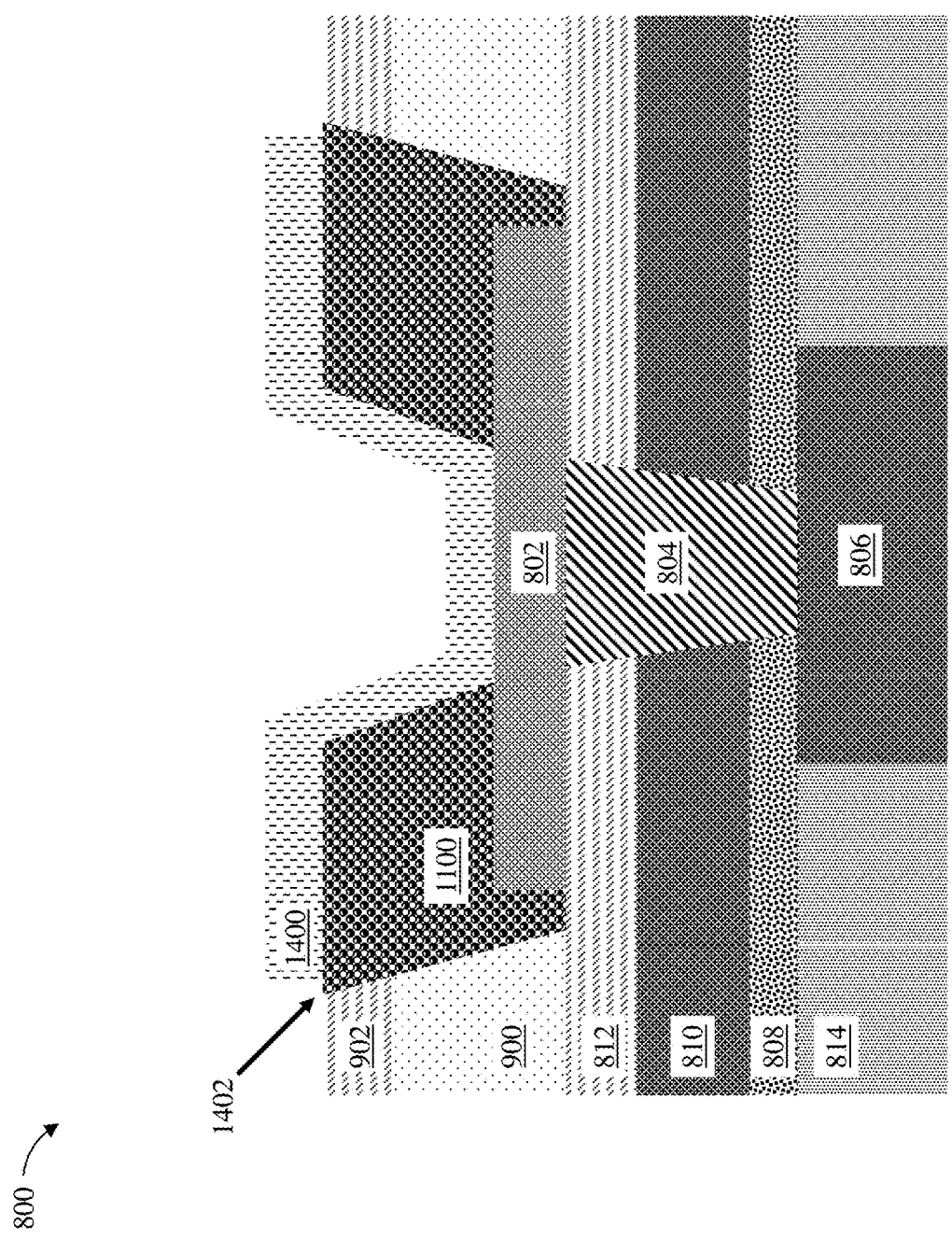
FIG. 14 depicts a cross-sectional view of the structure after forming the BLM pad on the exposed surface of the contacting layer in the via trench according to one or more embodiments of the present invention.

FIG. 14 illustrates a cross-sectional view of the structure 800 after forming the BLM pad 1400 on the exposed surface of the contacting layer 802 in the via trench 1300 according to one or more embodiments. The BLM pad 1400 can be formed using any known technique, such as, for example, deposition. Portions of the BLM pad 1400 (i.e., edge regions of the BLM pad 1400) extend over a surface of the PSPI region 1100. Depending on the outer diameter of the PSPI region 1100 and the diameter of the BLM pad 1400, portions of the PSPI region 1100 can extend beyond an edge of the BLM pad 1400 to form a PSPI extension 1402. In some embodiments, the PSPI extension 1402 extends about 5 microns to about 10 microns beyond the BLM pad 1400. The PSPI extension 1402 can be shortened or lengthened to any length, or eliminated entirely, by adjusting the relative diameters of the PSPI region 1100 and the BLM pad 1400 and by adjusting a thickness of the PSPI region 1100, e.g., by increasing or decreasing the size of the cavity 904 (as depicted in FIG. 10).

As discussed previously herein, forming an annular PSPI region rather than a complete PSPI layer under the BLM pad 1400 significantly reduces wafer warpage. Because an edge of the BLM pad 1400 extends over portions of the PSPI region 1100 in this configuration, the PSPI material is also able to significantly mitigate ULK stresses (see, e.g., the graph of ULK Peeling Stress vs PSPI Volume Fraction in FIG. 16). By adjusting the PSPI volume fraction (i.e., increasing or decreasing a thickness of the PSPI region 1100) and configuration (i.e., PSPI annulus, PSPI annulus with 5 micron extension, etc.) a sweet spot having acceptable levels of both ULK stresses and wafer warpage can be reached for a given application.

Figure 15:
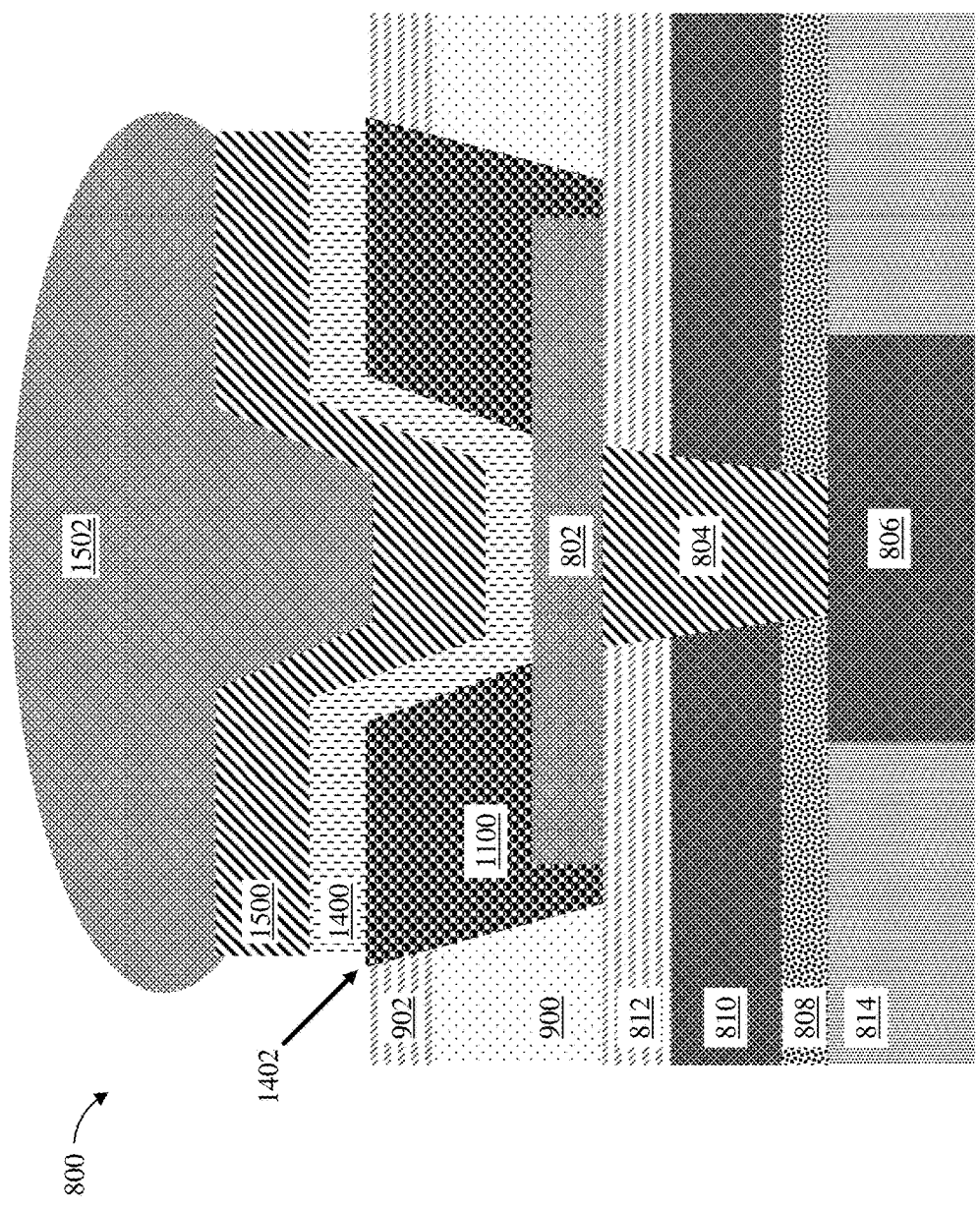
FIG. 15 depicts a cross-sectional view of the structure after forming a conductive pedestal on a surface of the BLM pad according to one or more embodiments of the present invention.

FIG. 15 illustrates a cross-sectional view of the structure 800 after forming a conductive pedestal 1500 on a surface of the BLM pad 1400 according to one or more embodiments. The conductive pedestal 1500 can be any suitable material, such as, for example a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. In some embodiments, the conductive pedestal 1500 is a copper pedestal formed on a copper seed layer (not depicted). In some embodiments, the conductive pedestal 1500 is a multilayer metallization stack, such as, for example, a two layer stack (e.g., TiW/Cu or Ti/Cu) or a four layer stack (e.g., Ni/Cu/Ni/Cu). In some embodiments, the conductive pedestal 700 is a three layer Cu/Ni/Au stack formed during a 2.5D/3D process flow for an interposer wafer. A solder bump 1502 is formed on the conductive pedestal 1500. In some embodiments, the solder bump 1502 is a lead free solder bump, such as, for example, SnAg or a SnAg alloy.

Figure 16:
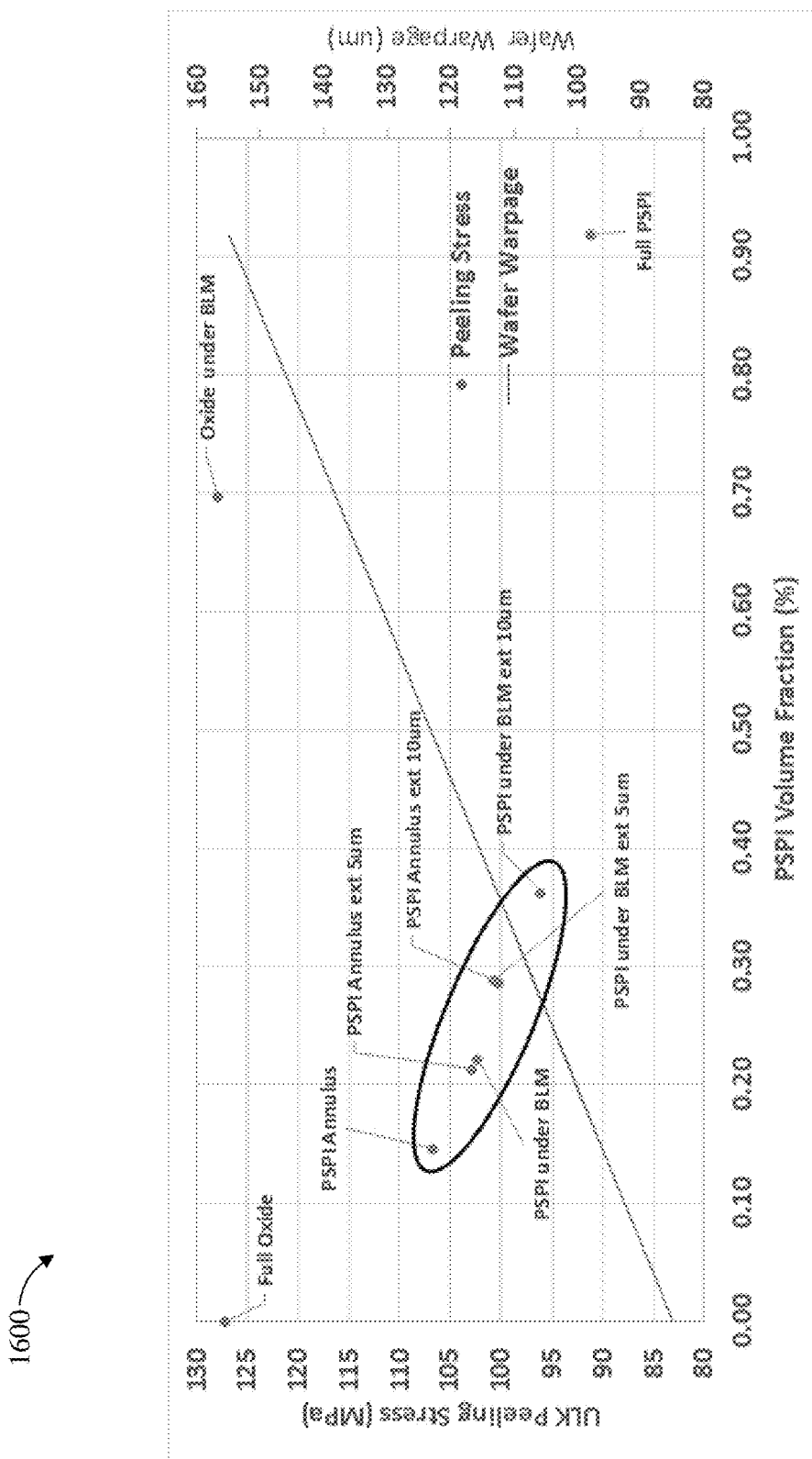
FIG. 16 illustrates a composite graph of ULK Peeling Stress and Wafer Warpage vs PSPI Volume Fraction.

FIG. 16 illustrates a composite graph 1600 of ULK Peeling Stress and Wafer Warpage vs PSPI Volume Fraction. As depicted in graph 1600, wafer warpage tends to increase linearly with the PSPI Volume Fraction. Also depicted are conventional approaches (e.g., full oxide or full PSPI) having large tradeoffs between ULK stresses and wafer warpage. For example, a full oxide approach has a minimal wafer warpage of about 80 to about 90 microns but a ULK peeling stress of about 125 to about 130 MPa. By comparison, annular PSPI regions formed according to one or more embodiments provide both a low wafer warpage and low ULK peeling stress. For example, an annular PSPI region having a 10 micron extension under the BLM pad according to one or more embodiments provides a wafer warpage of about 105 to about 110 microns and a ULK peeling stress of about 100 MPa. In some embodiments, a compressive oxide can be used to even further decrease the wafer level warpage.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a contacting layer on a surface of a silicon nitride layer and a via in a dielectric stack comprising a nitrogen-doped silicon carbide layer, the silicon nitride layer, and a silicon oxide layer positioned between the nitrogen-doped silicon carbide layer and the silicon nitride layer;
    forming a first dielectric layer on a surface of the contacting layer and on a surface of the silicon nitride layer;
    removing a first portion of the first dielectric layer, thus patterning an opening in the first dielectric layer having a shape defined by an inner circular wall and an outer circular wall, the inner circular wall and the outer circular wall being concentric with each other;
    filling the opening with a photosensitive polyimide (PSPI);
    removing a second portion of the first dielectric layer, thus exposing a surface of the contacting layer;
    forming a barrier layer metallurgy (BLM) pad on the surface of the contacting layer and over portions of the opening such that portions of the BLM pad are in contact with portions of the PSPI;
    forming a conductive pedestal on a surface of the BLM pad; and
    forming a solder bump on a surface of the conductive pedestal.

2. The method of claim 1, further comprising:
    forming a second dielectric layer over the first dielectric layer.

3. The method of claim 1, wherein filling the opening with the PSPI further comprises:
    a spin on coating process for filling the opening with PSPI to a thickness of 1 to 2 microns thicker than a total thickness of the first and second dielectric layers; and
    an ashing process thus planarizing the PSPI to a surface of the second dielectric layer.

4. The method of claim 1, wherein an outer diameter of the opening is 5 microns to 10 microns larger than a diameter of the BLM pad.

5. The method of claim 1, wherein an outer diameter of the opening is equal to a diameter of the BLM pad.

6. The method of claim 1, wherein the conductive pedestal comprises copper.

* * * * *